(12) United States Patent
Okamoto et al.

(10) Patent No.: US 6,842,080 B1
(45) Date of Patent: Jan. 11, 2005

(54) LC OSCILLATOR FORMED ON A SUBSTRATE

(75) Inventors: Akira Okamoto, Ageo (JP); Takeshi Ikeda, Tokyo (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 09/980,960

(22) PCT Filed: May 18, 1999

(86) PCT No.: PCT/JP99/02567

§ 371 (c)(1),
(2), (4) Date: Oct. 29, 2001

(87) PCT Pub. No.: WO00/70740

PCT Pub. Date: Nov. 23, 2000

(51) Int. Cl.[7] ................................................. H03B 5/00
(52) U.S. Cl. .............................. 331/117 R; 331/117 FE; 331/167; 331/108 C; 333/184
(58) Field of Search .......................... 331/117 R, 108 C, 331/167, 117 FE; 330/184

(56) References Cited

U.S. PATENT DOCUMENTS 5,095,357 A     3/1992  Andoh et al. ................. 257/379
6,664,863 B1 *  12/2003 Okamoto et al. ......... 331/117 R

FOREIGN PATENT DOCUMENTS

| EP | 0 661 805 | 7/1995 |
|----|-----------|--------|
| JP | 48-44755  | 6/1973 |
| JP | 60-136156 | 9/1985 |
| JP | 7-336138  | 12/1995 |
| JP | 8-097373  | 12/1996 |
| JP | 10-284691 | 10/1998 |

OTHER PUBLICATIONS

Patent Abstracts of Japan, vol. 1996, No. 04 Apr. 30, 1996, JP–07 336138 (Abstract) Dec. 22, 1995.

A. Kral et al; "RF–CMOS Oscillators with Switched Tuning"; Custom Integrated Circuits Conference; 1998; Proceedings of the IEEE 1998; Santa Clara, California; May 11–14, 1998; pp 555–558.

* cited by examiner

Primary Examiner—Arnold Kinkead
(74) Attorney, Agent, or Firm—Dellett & Walters

(57) ABSTRACT

An inductor element 30 effectively functions even when formed on a substrate and comprises two upper and lower conductors 1, 2 spirally formed on the front side of a semiconductor substrate 3. The conductors 1, 2 have substantially the same shape. When viewed from the above of the front side of the substrate 3, the two conductors 1, 2 are superposed one on the other almost exactly. Lead wires 6a, 6b are connected to the outer end (outer peripheral end) and the inner end (center end) of the conductor 1, respectively. The outer end of the conductor 1 is connected to the inner end of the conductor 2 through a connection wire 6c. The conductor 1 functions as an inductor conductor and is connected to a circuit provided on the semiconductor substrate 3 through the lead wires 6a, 6b.

27 Claims, 10 Drawing Sheets

F/G. 6

F I G. 10
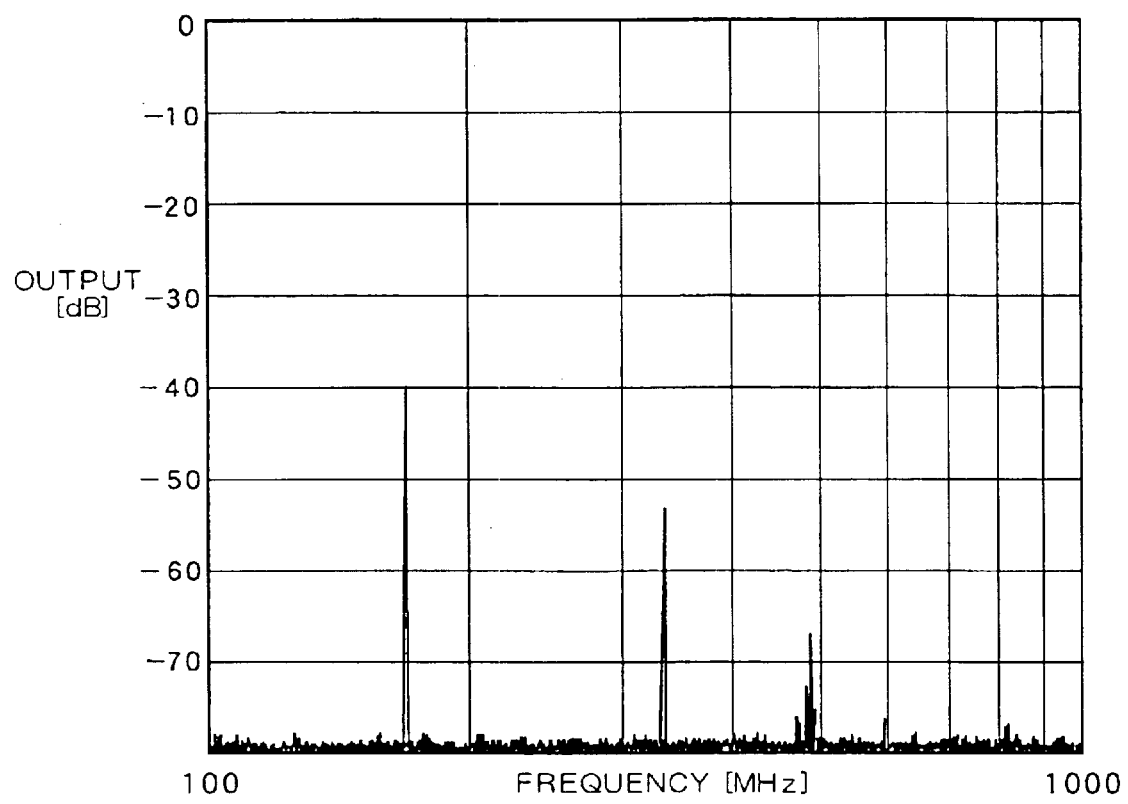

LC OSCILLATOR FORMED ON A SUBSTRATE

TECHNICAL FIELD

The present invention relates to an LC oscillator that can be formed on various kinds of substrates such as a semiconductor substrate.

BACKGROUND ART

There is known such a semiconductor circuit that forms a spiral pattern on a semiconductor substrate by using thin film forming technique, and uses this pattern as an inductor element. When current flows in such an inductor element that is formed on a semiconductor substrate, magnetic flux is generated in the direction perpendicular to a spiral pattern. Nevertheless, since eddy currents are induced on the front side of the semiconductor substrate by this magnetic flux to cancel effective magnetic flux, there is such a problem that doesn't effectively function as the inductor element. In particular, since the higher a frequency of a signal which flows in the inductor element becomes, the more remarkable this inclination becomes, and consequently it is difficult to form an LC oscillator, including the inductor element as a resonance element, on a semiconductor substrate.

DISCLOSURE OF THE INVENTION

The present invention is achieved in view of such a point. Its object is to provide an LC oscillator that can perform oscillation even if the inductor element is formed on a substrate.

An LC oscillator of the present invention comprises an inductor element constituted by forming two conductors in piles with sandwiching an insulating layer, mutually connecting both odd ends of them, and using the upper conductor as an inductor conductor. It is experimentally confirmed that an inductor element that has such structure has predetermined inductance without losing an inductance component by eddy currents etc. even if the inductor element is formed on a substrate. With using this inductor element as a part of an LC oscillator, oscillation can be performed even if the LC oscillator is formed on the substrate.

In addition, as a substrate mentioned above, it is preferable to use a semiconductor substrate. In particular, if the inductor element that effectively functions can be formed on a semiconductor substrate, it is possible to form each configuration parts for LC oscillator, including the inductor element, on the semiconductor substrate. Hence it becomes possible to form the whole of the LC oscillator on the semiconductor substrate without using any external parts.

In addition, it is preferable to form two conductors as described above, in the long shapes having substantially the same shape. Since an upper conductor never directly faces the front side of the substrate owing to making the two conductors the same in shapes, it is possible to reduce the eddy currents that are generated on the substrate when the upper conductor directly faces the substrate. In addition, it is possible to give predetermined inductance to the upper conductor by making the shapes of the two conductors be long. In particular, since it is possible to give large inductance to a conductor when the conductor is formed in one or more turns of spiral shape or a meander shape, the conductor is suitable for being built in an LC oscillator having comparatively low oscillation frequency. In addition, since it is possible to give a small inductance to a conductor when the conductor is formed in a circular shape less than one turn or an substantially linear shape, the conductor is suitable for being built in an LC oscillator having comparatively high oscillation frequency.

Moreover, when two conductors are made in spiral shapes, it is preferable to connect an inner end of one conductor with an outer end of another conductor. Since it is experimentally confirmed that it is possible to secure further large inductance when an inductor conductor is formed on a substrate owing to performing such connection, it is possible to realize the inductor element that effectively functions on a substrate.

In addition, the inductor element described above is suitable for use as a compound element that also has a capacitance component besides an inductance component. Since this inductor element has two conductors, mutually superimposed, and a capacitance component is also included in its characteristics, the characteristics of this inductor element can be effectively used by using this inductor element as one part of the LC oscillator where an inductor and a capacitor are used in combination.

BRIEF DESCRIPTION OF THE DRAWINGS

FIG. 10 is a chart showing measurement result of an output characteristic of an LC oscillator.

BEST MODE FOR CARRYING OUT THE INVENTION

Hereafter, an LC oscillator according to an embodiment where the present invention is applied will be specifically described with referring to drawings.

Figure 1:
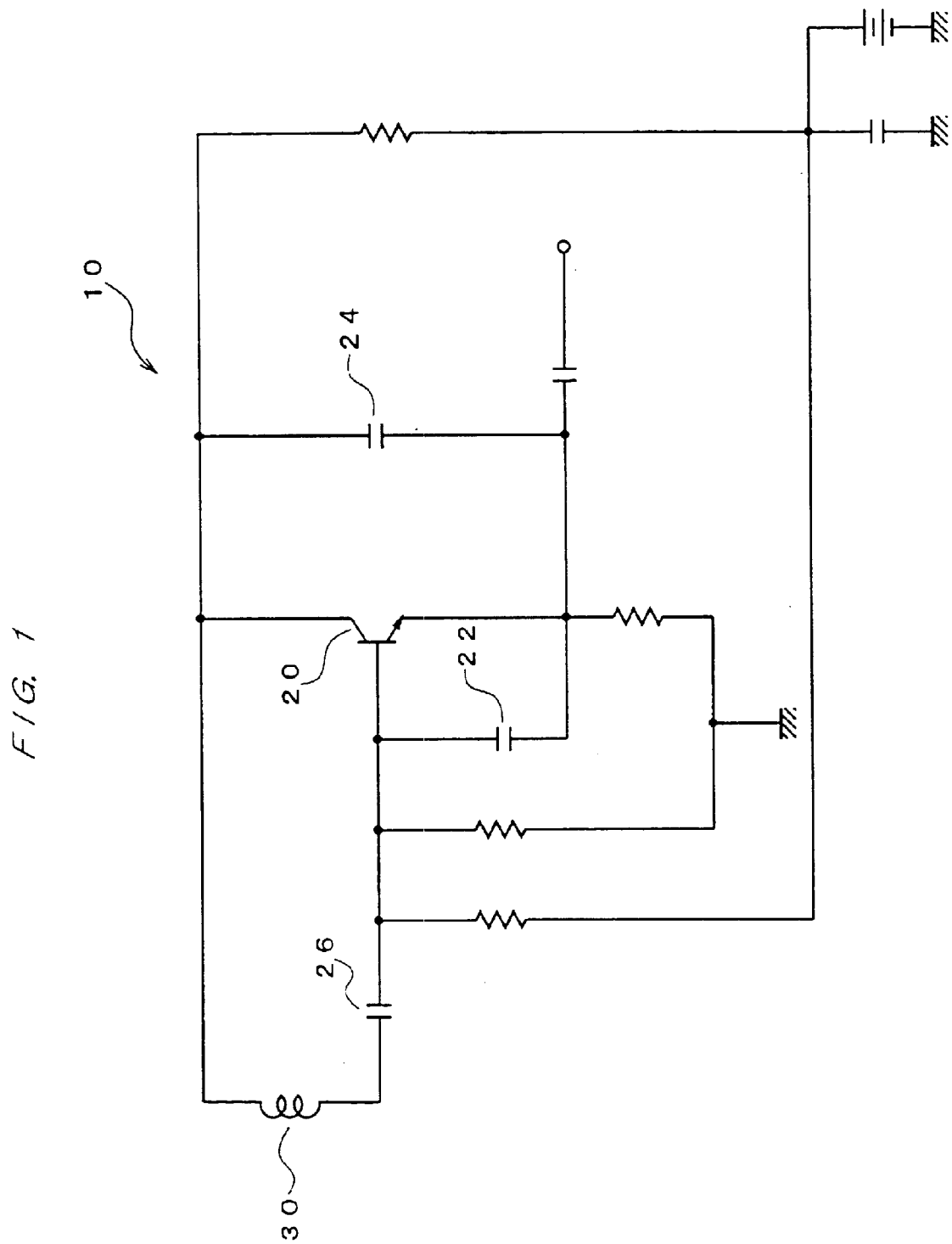
FIG. 1 is a circuit diagram showing a configuration of an LC oscillator according to an embodiment.

FIG. 1 is a circuit diagram showing a configuration of an LC oscillator according to an embodiment. An LC oscillator 10 shown in FIG. 1 has a transistor 20, a capacitor 22 connected between the base and the emitter of the transistor 20, a capacitor 24 connected between the emitter and the collector of the transistor 20, a capacitor 26 connected serially between the base and the collector of the transistor 20 and an inductor element 30.

In this LC oscillator, the capacitance of two capacitors 22 and 24 may be several tens times the between-terminal capacity of a transistor 20. In addition, an inductor element 30 is connected through a capacitor 26.

An LC oscillator 10 having the configuration described above in this embodiment is a Clapp circuit that is an advanced Colpitts circuit. In the LC oscillator 10, a capacitor of a resonant circuit that determines an oscillation frequency becomes equivalent to series connection of capacitors 22, 24, and 26. Hence, it is possible to select larger capacitance of capacitors 22 and 24 than that of the Colpitts circuit that does not have a capacitor equivalent to the capacitor 26. Therefore, even if the capacitance between terminals of a transistor 20 changes, it does not give large influence to the resonant frequency of a resonant circuit, and hence it is possible to improve the stability of the oscillation frequency.

Figure 2:
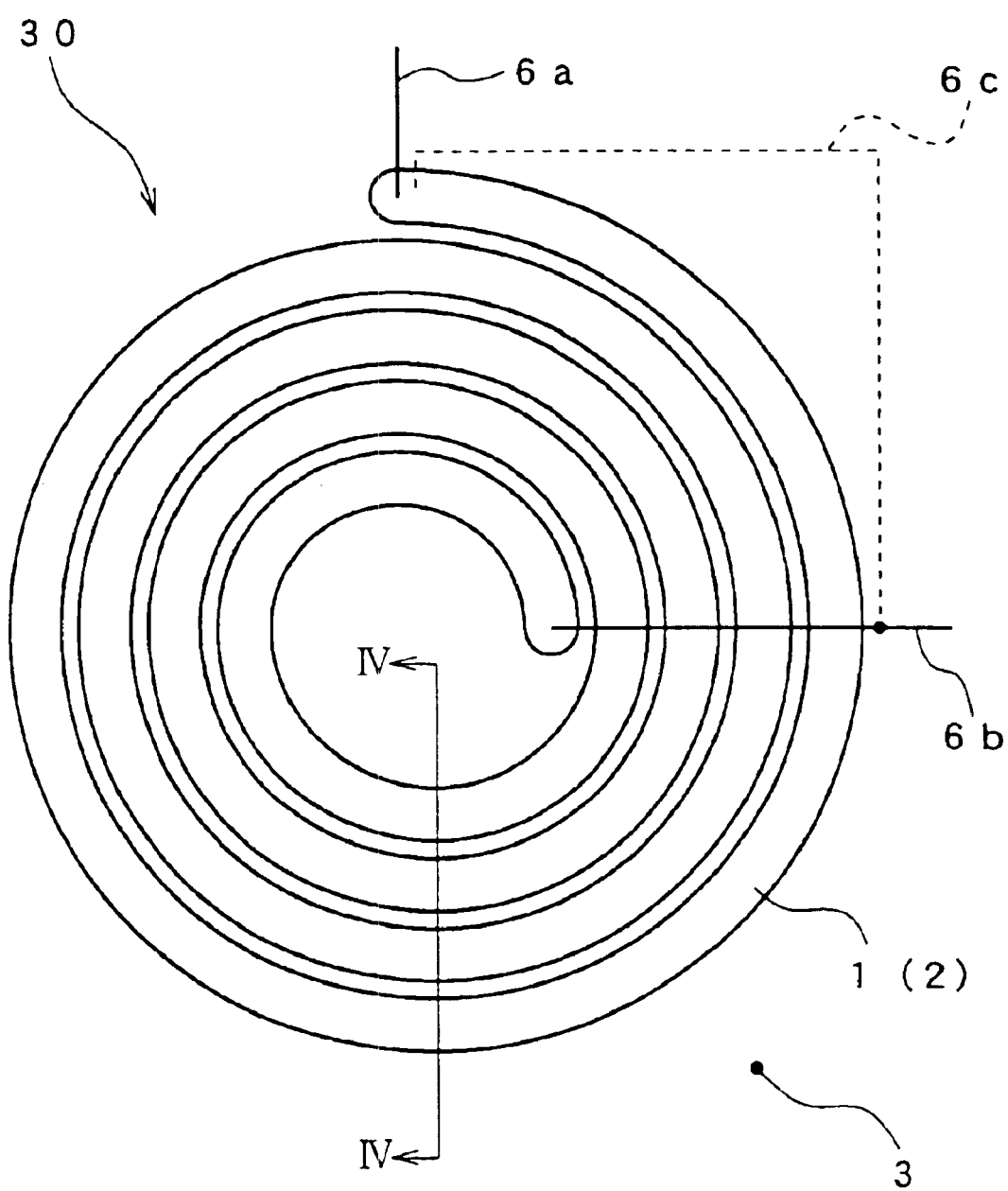
FIG. 2 is a schematic diagram showing a planar structure of an inductor element included in the LC oscillator shown in FIG. 1.

FIG. 2 is a schematic diagram showing a planar structure of an inductor element 30 included in the LC oscillator 10 according to this embodiment. An inductor element 30 has two conductors 1 and 2 that have spiral shapes and are formed in the front side of a semiconductor substrate 3.

These two conductors 1 and 2 have substantially the same shape. As shown in FIG. 2, when viewed from the front side of the semiconductor substrate 3, they are formed so that the conductor 1, which becomes an upper layer, and another conductor 2, which becomes a lower layer, are formed by being superimposed one on the other substantially exactly. Each of the conductors 1 and 2 is formed of a thin film of metal such as aluminum or gold, or semiconductor material such as poly silicon.

Figure 3:
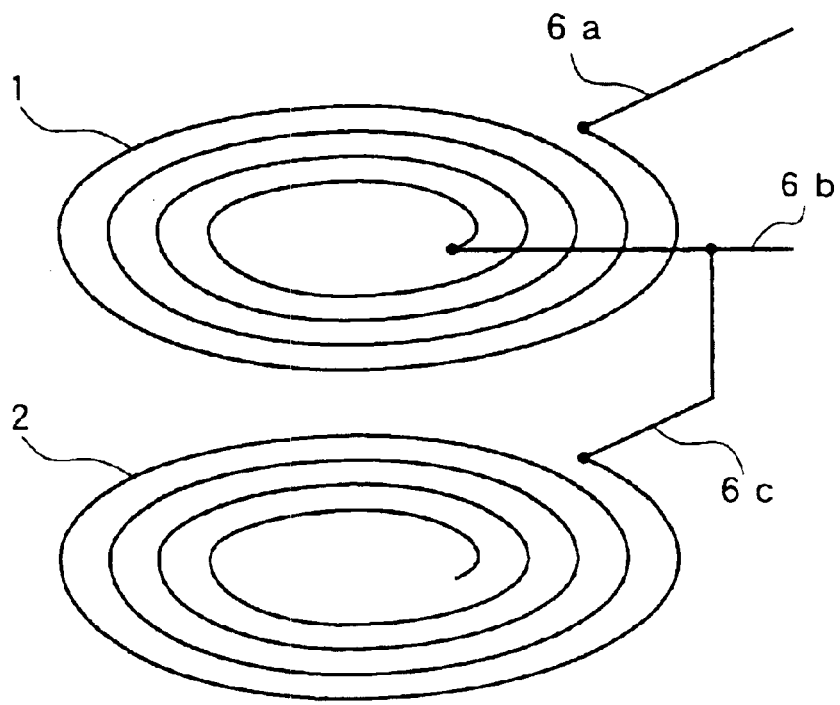
FIG. 3 is a schematic diagram showing a connection state of two conductors shown in FIG. 2.

FIG. 3 is a schematic diagram showing a connection state of the two conductors 1 and 2, described above. As shown in FIG. 3, lead wires 6a and 6b are connected to an outer end (outer circumferential end) and an inner end (inner circumferential end) of the upper conductor 1 respectively, and the inner end of the upper conductor 1 and the outer end of the lower conductor 2 are connected with a connection wire 6c.

The upper conductor 1 functions as an inductor conductor, and is connected to the other configuration parts of the LC oscillator 10 formed on the semiconductor substrate 3 through the lead wires 6a and 6b connected to ends thereof.

Figure 4:
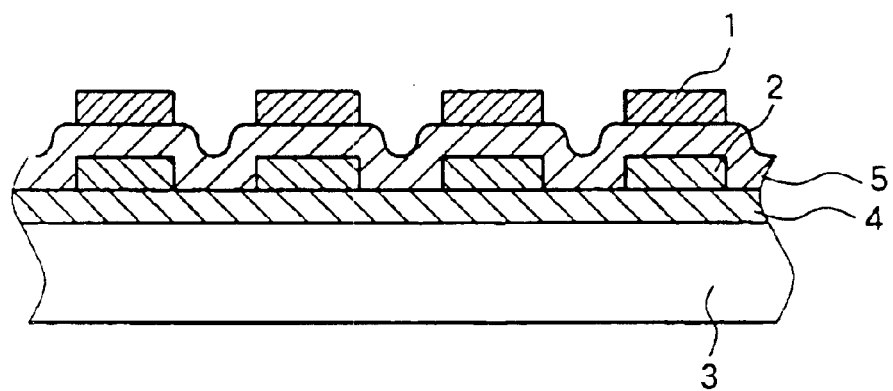
FIG. 4 is an expanded sectional view taken on a line IV—IV in FIG. 2.

FIG. 4 is an expanded sectional view taken on a line IV—IV in FIG. 2. As shown in FIG. 4, an insulating layer 4 is formed on the front side of the semiconductor substrate 3, and the conductor 2 with a spiral shape is formed in a part of a top face of the insulating layer 4. In addition, an insulating layer 5 is formed on a top face of the insulating layer 4 and conductor 2, and the conductor 1 is formed on a top face thereof.

The inductor element 30 included in the LC oscillator 10 according to this embodiment has the structure described above. Since predetermined inductance appears between two lead wires 6a and 6b connected to both ends of the upper conductor 1 respectively, this upper conductor 1 can be used as an inductor conductor. In addition, under this upper conductor 1, the conductor 2 that has substantially the same shape as this conductor 1 is formed. It is possible to suppress the generation of eddy currents in the front side of the semiconductor substrate 3 when an upper conductor 1 is used as an inductor conductor, by connecting one end of the upper conductor 1 with one end of the lower conductor 2 with the connection wire 6c. Hence it is possible to make the upper conductor 1 effectively function as an inductor conductor. Therefore, it becomes possible to integrate the entire LC oscillator 10, including the inductor element 30, in one piece on the semiconductor substrates 3.

Next, the result of a comparative experiments for estimating the characteristics of the inductor element 30 according to this embodiment described above will be described.

Figure 5:
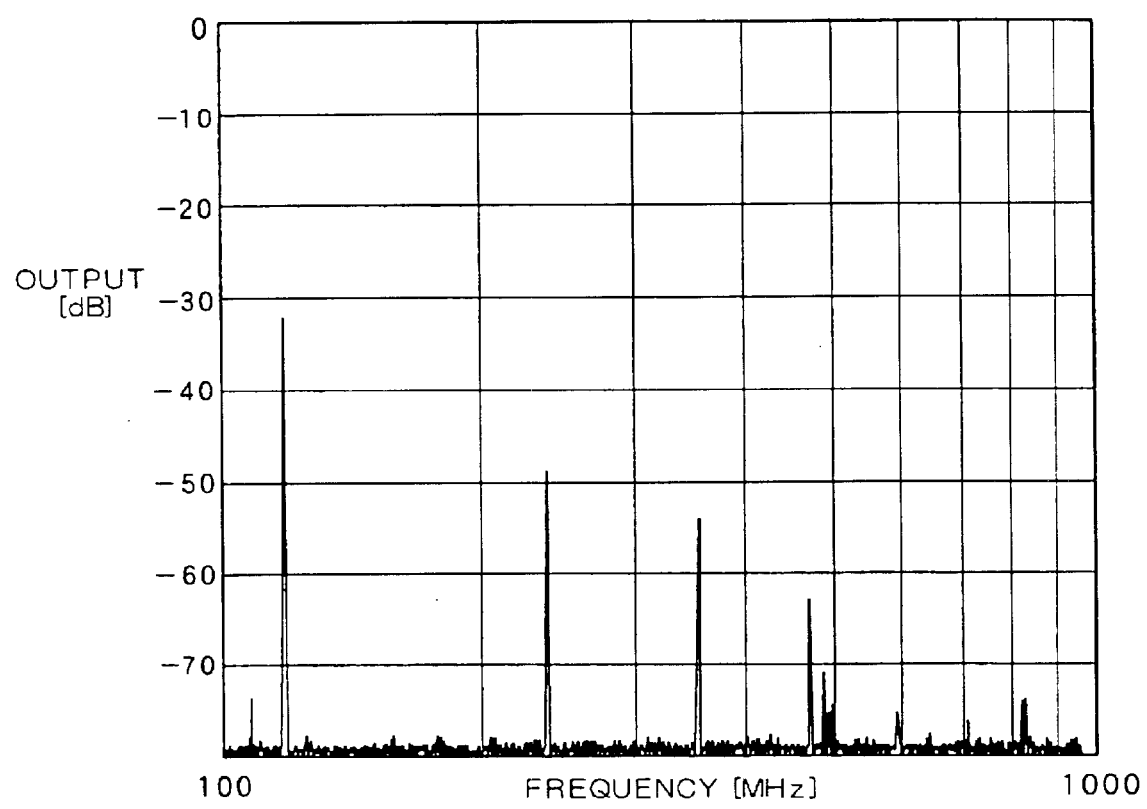
FIG. 5 is a chart showing measurement result of an output characteristic of an LC oscillator.

FIG. 5 is a graph showing the measurement result of the output characteristics of an LC oscillator configured with an inductor element which has an electrode of one layer having the same shape as the conductor 1 included in the inductor element 30. As for the inductor element used in this measurement of the output characteristics, a five-turn electrode having one-mm pattern width and a 0.2-mm adjacent gap of spiral pattern was formed on a front side of a 0.13-mm-thick insulating member with a dielectric constant of 3.17. In addition, vertical axes in FIG. 5 (this is the same also in FIGS. 6 through 10 which are described later) denote output amplitudes logarithmically expressed, and horizontal axes denote the frequencies of output signals logarithmically expressed, respectively. As shown in FIG. 5, an oscillation frequency of 119 MHz was observed when the LC oscillator performs in the state with sufficiently separating the inductor element including such an electrode of one layer from other conductor substrate or semiconductor substrate.

Figure 6:
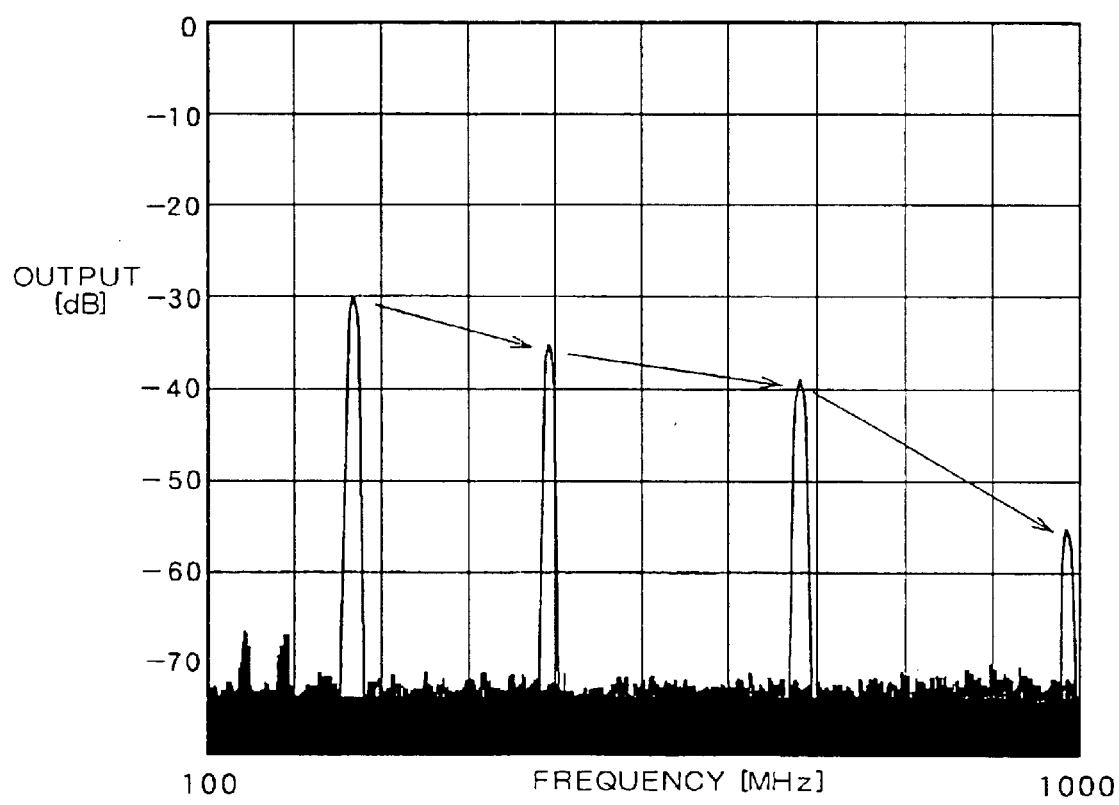
FIG. 6 is a chart showing measurement result of an output characteristic of an LC oscillator.

FIG. 6 is a graph showing the output characteristic of an LC oscillator at the time of gradually bringing a copper plate, which is a conductive substrate, close to the inductor element used for the measurement of the output characteristics shown in FIG. 5. As shown in FIG. 6, it was observed that, when the copper plate was gradually brought close to this inductor element in the state of oscillation with using the inductor element comprising one layer of electrode, the oscillation frequency became higher from 118 MHz to 139 MHz, 168 MHz, or 198 MHz. Furthermore, it was observed that oscillation stopped when the copper plate was closely contacted to the electrode with sandwiching an insulating member having the thickness of 3.17 mm.

Thus, if an inductor element simply made of one layer of electrode in a spiral shape is adopted and is formed on a copperplate, oscillating operation of an LC oscillator stops. This is because the inductance that the inductor element comprising one layer of electrode has becomes small by making the copper plate approach the inductor element. The reason why the inductance becomes, small when the copper plate is made to approach the inductor element may be that eddy currents arise on a surface of the copper plate owing to the magnetic flux generated when a signal is inputted into an electrode to cancel this magnetic flux.

Figure 7:
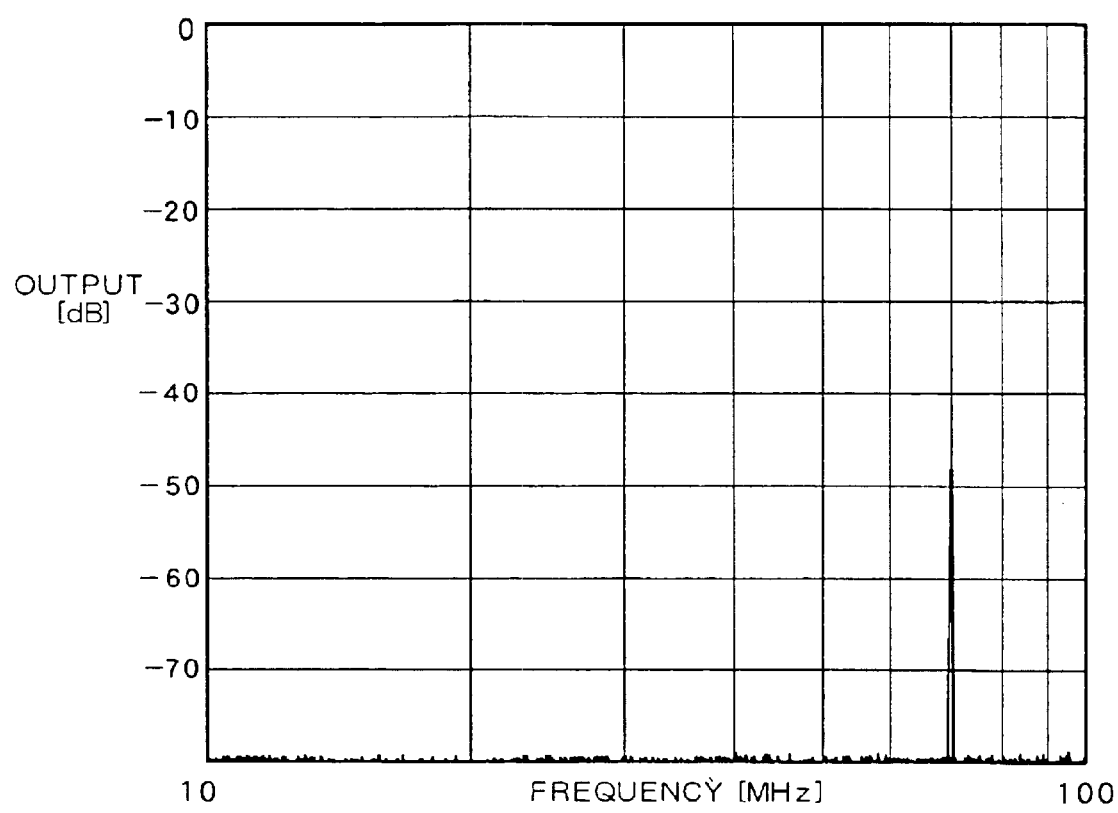
FIG. 7 is a chart showing measurement result of an output characteristic of an LC oscillator.
Figure 8:
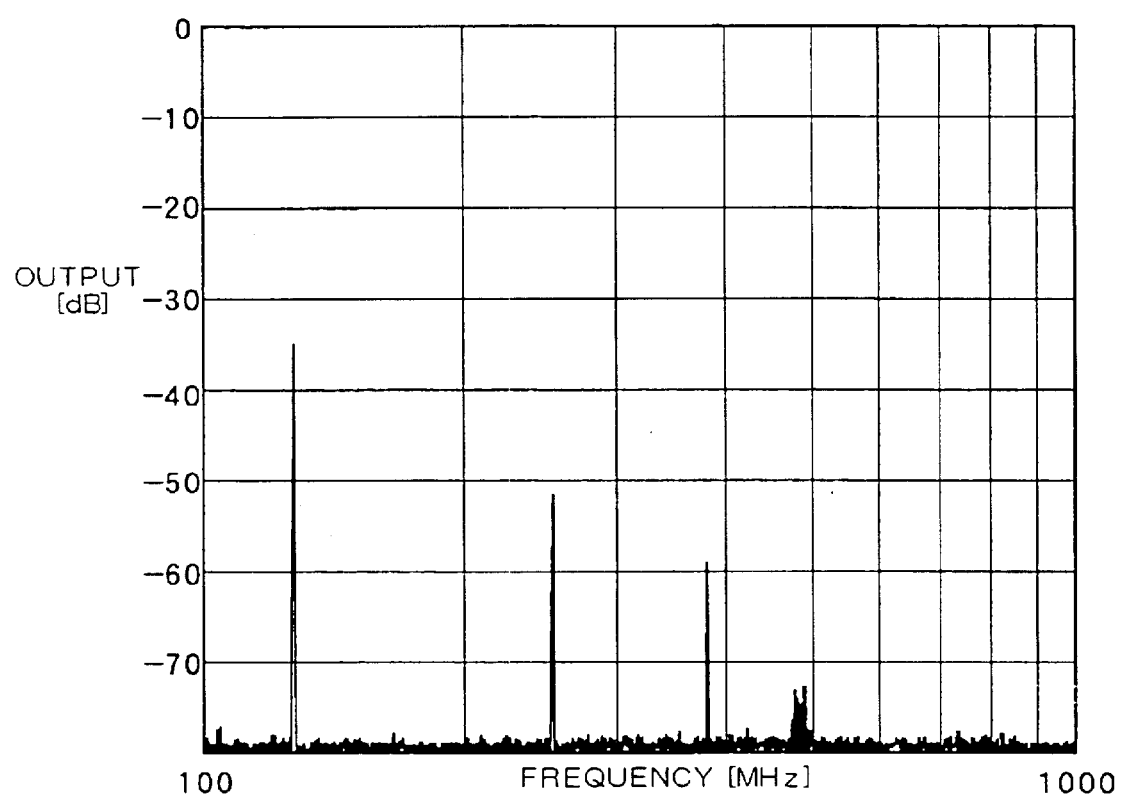
FIG. 8 is a chart showing measurement result of an output characteristic of an LC oscillator.

FIG. 7 is a graph showing the measurement result of the output characteristic in the case of configuring an LC oscillator with using two layers of electrodes that have the same shape and arrangement as two conductors 1 and 2 included in the inductor element 30 shown in FIG. 2. In addition, FIG. 8 is a graph showing the output characteristic of an LC oscillator in the case of closely contacting a copper plate to an inductor element having the same shape and arrangement as two conductors 1 and 2 included in the inductor element 30.

The inductor element used for these measurements has the structure that an electrode corresponding to the conductor 2 shown in FIG. 2 is added to the inductor element shown in the measurement result in FIGS. 5 and 6. In addition, if closely contacting the copper plate to this inductor element, the lower electrode and copper plate are arranged through an adequate thin insulating member.

In the state of sufficiently separating an inductor element from other conductive members, an LC oscillator using the inductor element where two layers of spiral electrodes are located with facing each other has an oscillation frequency near 70 MHz as seen from the measurement result shown in FIG. 7. The reason why this oscillation frequency becomes lower than the oscillation frequency (119 MHz) at the time of using the inductor element comprising one layer of electrode shown in FIG. 5 is that, since the inductor element comprising two layers of electrodes function as a compound device which has an inductance component and a capacitance component, this capacitance component lowers a resonant frequency of the resonant circuit including the inductor element.

In addition, in a state of closely contacting the inductor element having the electrode of two layers mentioned above to the copperplate, as shown in FIG. 8, a similar result appears although the position of a oscillation frequency (127 MHz) shifts. This shows that, by using the inductor element that has the double structure of the electrodes described above, even if the inductor element is closely contacting to the copper plate, the inductance component does not disappear and the function as an inductor conductor is maintained.

Thus, the inductor element made by forming two layers of electrodes in a spiral shape functions as an inductor conductor without the inductance component disappearing even if a copper plate is closely contacted to one (the electrode opposite to the electrode used as an inductor conductor) of them, and the oscillating operation of the LC oscillator where this is used is maintained. Hence even if each component of the LC oscillator 10 including this inductor conductor 30 is formed on the semiconductor substrate 3, it is possible to make the LC oscillator 10 perform oscillating operation by using the inductor element 30 in this embodiment which has the fundamentally same structure.

The present invention is not limited to the above-described embodiment, but various types of modifications are possible within the scope of the gist of the present invention. For example, in the inductor element 10 shown in FIGS. 2 and 3, the inner end of the upper conductor 1 and the outer end of the lower conductor 2 are connected through the connection wire 6c. Nevertheless, on the contrary, it can be also performed to mutually connect the outer end of the upper conductor 1 and the inner end of the lower conductor 2. In addition, it can be also performed to connect either outer ends or both inner ends of conductors 1 and 2 when it is allowed that the inductance of an inductor element becomes small to some extent.

Figure 9:
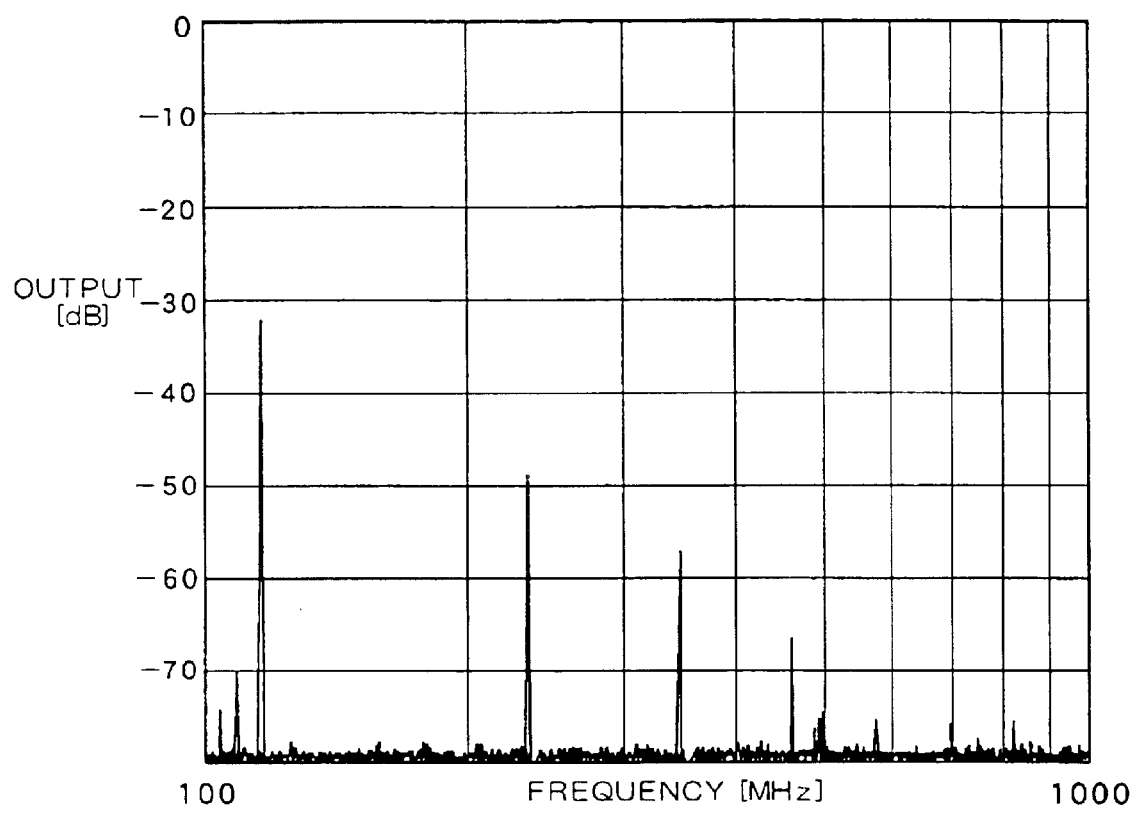
FIG. 9 is a chart showing measurement result of an output characteristic of an LC oscillator.

FIG. 9 is a graph showing the measurement result of the output characteristic in the case of configuring an LC oscillator with using an inductor element that has two layers of electrodes in the same shape and arrangement as two conductors 1 and 2 included in the inductor element 30 shown in FIG. 2 and in which each outer circumferential end of the two electrodes is mutually connected. In addition, FIG. 10 is a graph showing the measurement result of the output characteristic of the LC oscillator at the time of closely contacting the copper plate to the inductor element used for the characteristic measurement shown in FIG. 9. As shown in these figures, in the LC oscillator where the inductor element in which both outer circumferential ends of two electrodes are mutually connected is used, its oscillation frequency changes from 117 MHz to 171 MHz by closely contacting the copper plate. Nevertheless, oscillating operation is maintained without stopping.

Figure 11A:
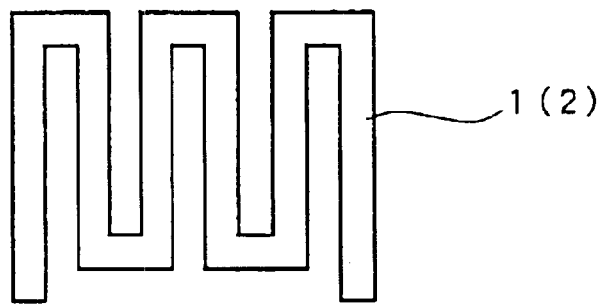
FIGS. 11A through 11C are schematic diagrams showing modified examples of the conductors included in inductor elements.
Figure 11B:
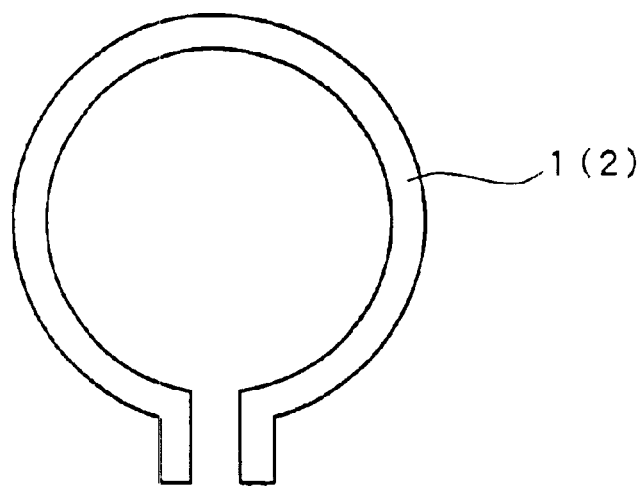
Figure 11C:
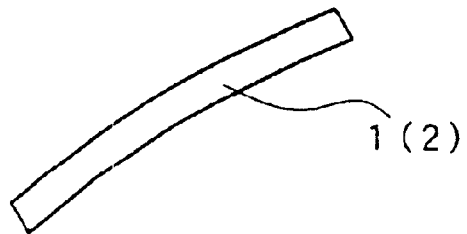

In addition, since two conductors 1 and 2 included in the inductor element 30 are formed in spiral shapes in the embodiment described above, it is possible to realize the inductor element 30 having large inductance. Nevertheless, it is also good to form two conductors 1 and 2 in meander shapes (FIG. 11A). In addition, the inductance of this inductor element 30 can be small when it is used as one part of a high frequency oscillator. Hence it is also good to form the inductor element 30 less than one turn by reducing the numbers of turns of the conductors 1 and 2 (FIG. 11B), or to form it in an substantially linear shape (FIG. 1C).

In addition, although the shapes of two conductors 1 and 2 are set substantially similarly in the embodiment described above, it is also good to set them in different shapes. For example, it can be also performed to set the number of turns of the lower conductor 2 to be more than that of the upper conductor 1. Thus, since the upper conductor 1 does not directly face the semiconductor substrate 3 if all or some of the lower conductor 2 is arranged under the upper conductor 1, it is possible to effectively prevent the generation of eddy currents due to the upper conductor 1.

In addition, although the inductor element 30 is formed by forming two conductors 1 and 2 on the semiconductor substrate 3 in the embodiment described above, the inductor element 30 in which two conductors 1 and 2 are formed on a conductor substrate such as a metal is also realizable. From the experimental result shown in FIG. 8, it is confirmed that, even in this case, this effectively functions as the inductor element 30 and that the LC oscillator performs oscillating. If it becomes possible to form the inductor element 30 by closely contacting it on a conductor substrate, it also becomes possible to arrange the inductor element 30 on a front side of a metal shielding case or the like. Hence it becomes easy to secure an installation space of the inductor element.

Furthermore, although a Clapp circuit is used as an LC oscillator in the embodiments described above, it is also good to use another LC oscillator such as a Colpitts circuit that makes oscillating operation, where the resonance of an inductor and a capacitor is used, performed. Even in this case, by using an inductor element having the structure shown in FIG. 2 etc. as an inductor element included in the LC oscillator, it is possible to realize an LC oscillator which performs oscillating operation on a semiconductor substrate or a conductor substrate.

INDUSTRIAL APPLICABILITY

As described above, according to the present invention, by forming two conductors one on the other on a substrate and connecting one end of one conductor with one end of the other, it is possible to use an upper conductor as an inductor conductor having predetermined inductance. Therefore, with using this inductor element as a part of an LC oscillator, oscillation can be performed even if the LC oscillator is formed on the substrate. In particular, according to the present invention, since an inductor element that effectively functions on a semiconductor substrate is realized, it becomes possible to integrate whole LC oscillator including an inductor, which is impossible up to now.

What is claimed is:

1. An LC oscillator using an inductor element formed on a substrate, characterized in that the inductor element has two conductors formed in piles on the substrate being mutually insulated, and wherein one end of one conductor is connected to the opposite end of the other conductor, an upper layer of the conductors is used as an inductor conductor, wherein one of said two conductors has an end that is near the substrate, and the end near the substrate is open.

2. The LC oscillator according to claim 1, characterized in that the substrate is a semiconductor substrate, and components are formed on the substrate in which the inductor element is formed.

3. The LC oscillator according to claim 1, characterized in that said two conductors have substantially the same shape.

4. The LC oscillator according to claim 1, characterized in that said two conductors have long shapes, and one end of one conductor in a longitudinal direction is connected with one end of the other in the longitudinal direction.

5. The LC oscillator according to claim 1, characterized in that said two conductors have circular shapes less than one turn, and one end of one conductor is connected with one end of the other.

6. The LC oscillator according to claim 1, characterized in that said two conductors have spiral shapes each number of turns of which is one or more, and one end of one conductor is connected with one end of the other.

7. The LC oscillator according to claim 1, characterized in that the two conductors are formed in substantially linear shapes, and one end of one conductor is connected with one end of the other.

8. The LC oscillator according to claim 1, characterized in that the two conductors are formed in meander shapes, and one end of one conductor is connected with one end of the other.

9. The LC oscillator according to claim 6, characterized in that an inner end of said one conductor is connected with an outer end of the other conductor.

10. The LC oscillator according to claim 1, characterized by further comprising:
  an inductance component of the one conductor that is an upper layer; and
  a capacitance component between the two conductors.

11. An LC oscillator using an inductor element formed on a substrate, characterized in that the inductor element has two conductors formed in piles on the substrate being mutually insulated, and wherein both odd ends are mutually connected, and further, an upper layer of the conductors is used as an inductor conductor, said two conductors have circular shapes less than one turn, and one end of one conductor is connected with one end of the other,
  wherein one of said two conductors has an end that is near the substrate, and the end near the substrate is open.

12. An LC oscillator using an inductor element formed on a substrate, characterized in that the inductor element has two conductors formed in piles on the substrate with being mutually insulated, and wherein both odd ends are mutually connected, and further, an upper layer of the conductors is used as an inductor conductor, the two conductors are formed in substantially linear shapes, and one end of one conductor is connected with one end of the other,
  wherein one of said two conductors has an end that is near the substrate, and the end near the substrate is open.

13. An LC oscillator using an inductor element formed on a substrate, characterized in that the inductor element has two conductors formed in piles on the substrate being mutually insulated, and wherein both odd ends are mutually connected, and further, an upper layer of the conductors is used as an inductor conductor, said two conductors have spiral shapes each number of turns of which is one or more, and one end of one conductor is connected with one end of the other, an inner end of said one conductor is connected with an outer end of the other conductor,
  wherein one of said two conductors has an end that is near the substrate, and the end near the substrate is open.

14. An LC oscillator using an inductor element formed on a substrate, characterized in that the inductor element has two spiral shape conductors formed in piles on the substrate being mutually insulated, and wherein an outer end of one conductor is connected to a corresponding outer end of the other conductor via a passive element,
  wherein one of said two conductors has an end that is near the substrate, and the end near the substrate is open.

15. The LC oscillator according to claim 14, characterized in that said two conductors have spiral shapes less than one turn.

16. The LC oscillator according to claim 14, characterized in that said two conductors have spiral shapes each number of turns of which is one or more.

17. The LC oscillator according to claim 14, wherein said passive element comprises a conductive element.

18. The LC oscillator according to claim 17, wherein said conductive element comprises a wire.

19. An LC oscillator using an inductor element formed on a substrate, characterized in that the inductor element has two spiral shape conductors formed in piles on the substrate being mutually insulated, and wherein an outer end of the one conductor most adjacent said substrate is connected to an inner end of the other conductor,
  wherein an inner end of the conductor most adjacent the substrate is open.

20. The LC oscillator according to claim 19, characterized in that said two conductors have spiral shapes less than one turn.

21. The LC oscillator according to claim 19, characterized in that said two conductors have spiral shapes each number of turns of which is one or more.

22. An LC oscillator using an inductor element formed on a substrate, characterized in that the inductor element has two conductors formed in piles on the substrate being mutually insulated, wherein said conductors have outer and inner ends, and wherein an outer end of one conductor is connected to a corresponding outer end of the other conductor via a passive element,
  wherein an inner end of the conductor most adjacent the substrate is open.

23. The LC oscillator according to claim 22, characterized in that said two conductors have spiral shapes each number of turns of which is one or more.

24. The LC oscillator according to claim 22, characterized in that the two conductors are formed in meander shapes.

25. An LC oscillator using an inductor element formed on a substrate, characterized in that the inductor element has two conductors formed in piles on the substrate being mutually insulated, wherein said conductors have an inner end and an outer end, and wherein an outer end of the one conductor most adjacent said substrate is connected to an inner end of the other conductor,
  wherein an inner end of the conductor most adjacent the substrate is open.

26. The LC oscillator according to claim 25, wherein characterized in that said two conductors have spiral shapes each number of turns of which is one or more.

27. The LC oscillator according to claim 25, characterized in that the two conductors are formed in meander shapes.

* * * * *